United States Patent
Croft (10) Patent No.: US 10,056,521 B2
(45) Date of Patent: Aug. 21, 2018

(54) WIRE NETWORK FOR INTERCONNECTING PHOTOVOLTAIC CELLS

(71) Applicant: Apollo Precision (Kunming) Yuanhong Limited, Kunming, Yunan (CN)

(72) Inventor: Steven Thomas Croft, Menlo Park, CA (US)

(73) Assignee: Beijing Apollo Ding Rong Solar Technology Co., Ltd., Beijing (CN)

( * ) Notice: Subject to any disclaimer, the term of this patent is extended or adjusted under 35 U.S.C. 154(b) by 0 days.

(21) Appl. No.: 14/822,712

(22) Filed: Aug. 10, 2015

(65) Prior Publication Data

US 2016/0204302 A1 Jul. 14, 2016

Related U.S. Application Data (60) Division of application No. 13/087,724, filed on Apr. 15, 2011, which is a continuation-in-part of
(Continued)

(51) Int. Cl.
*H01L 31/18* (2006.01)
*H01L 31/05* (2014.01)
*B32B 15/04* (2006.01)

(52) U.S. Cl.
CPC .......... *H01L 31/1876* (2013.01); *B32B 15/04* (2013.01); *H01L 31/0508* (2013.01);
(Continued)

(58) Field of Classification Search
None
See application file for complete search history.

(56) References Cited

U.S. PATENT DOCUMENTS

| 2,782,809 A | 2/1957 | Smallridge |
| 2,963,048 A | 12/1960 | Smith |

(Continued)

FOREIGN PATENT DOCUMENTS

| CA | 2260515 A2 | 7/1999 |
| CA | 2335159 | 12/1999 |

(Continued)

OTHER PUBLICATIONS

Translation of Radler et al. (DE 2757301 A1) (Year: 2018).*
(Continued)

*Primary Examiner* — Magali P Slawski
(74) *Attorney, Agent, or Firm* — Weaver Austin Villeneuve & Sampson LLP (57) ABSTRACT

Provided are novel interconnect wire network assemblies and methods of fabricating thereof. An assembly may include conductive portions/individual wires that, in certain embodiments, are substantially parallel to each other. The assembly also includes two or more carrier films (i.e., the front side and back side films) attached to opposite sides of the wires. The films are typically attached along the wire ends. The films are made from electrically insulating materials and at least the front side film is substantially transparent. The front side film is used to attach the wires to a photovoltaic surface of one cell, while the back side film is used for attachment to a substrate surface of another cell. These attachments electrically interconnect the two cells in series. In certain embodiments, one or both carrier films extend beyond two end wires and form insulated portions that allow much closer arrangements of the cells in a module.

10 Claims, 7 Drawing Sheets

Related U.S. Application Data application No. 12/566,555, filed on Sep. 24, 2009, now abandoned, which is a continuation-in-part of application No. 12/052,476, filed on Mar. 20, 2008, now Pat. No. 8,912,429.

(52) U.S. Cl.
CPC ........ *H01L 31/0512* (2013.01); *H01L 31/188* (2013.01); *B32B 2457/12* (2013.01); *Y02E 10/50* (2013.01)

(56) References Cited

U.S. PATENT DOCUMENTS

| | | |
|---|---|---|
| 3,025,889 A | 3/1962 | Clay |
| 3,376,164 A | 4/1968 | Bachwansky |
| 3,459,391 A | 8/1969 | Haynos |
| 3,553,030 A | 1/1971 | Lebrun |
| 3,561,500 A | 2/1971 | Rentz et al. |
| 3,713,893 A | 1/1973 | Shirland |
| 4,017,332 A | 4/1977 | James |
| 4,019,924 A | 4/1977 | Kurth |
| 4,166,918 A | 9/1979 | Nostrand et al. |
| 4,346,159 A | 8/1982 | Sadamatsu et al. |
| 4,366,335 A | 12/1982 | Feng et al. |
| 4,367,581 A | 1/1983 | Kohler |
| 4,499,658 A | 2/1985 | Lewis |
| 4,560,498 A | 12/1985 | Horsma et al. |
| 4,562,637 A | 1/1986 | Kushima |
| 4,567,642 A | 2/1986 | Dilts et al. |
| 4,574,160 A | 3/1986 | Cull et al. |
| 4,598,306 A | 7/1986 | Nath et al. |
| 4,633,033 A | 12/1986 | Nath et al. |
| 4,640,002 A | 2/1987 | Phillips et al. |
| 4,652,693 A | 3/1987 | Bar on |
| 4,694,117 A | 9/1987 | Friedrich et al. |
| 4,849,133 A | 7/1989 | Yoshida et al. |
| 5,034,068 A | 7/1991 | Glenn et al. |
| 5,158,618 A | 10/1992 | Rubin et al. |
| 5,330,583 A | 7/1994 | Asai et al. |
| 5,391,235 A | 2/1995 | Inoue |
| 5,458,694 A | 10/1995 | Nuyen |
| 5,474,621 A | 12/1995 | Barnard |
| 5,554,229 A | 9/1996 | Vogeli |
| 5,620,528 A | 4/1997 | Schade et al. |
| 5,626,688 A | 5/1997 | Probst et al. |
| 5,681,402 A | 10/1997 | Ichinose et al. |
| 5,759,291 A | 6/1998 | Ichinose et al. |
| 5,814,195 A | 9/1998 | Lehan et al. |
| 5,861,324 A | 1/1999 | Ichinose et al. |
| 6,093,581 A | 7/2000 | Takabayashi |
| 6,093,884 A | 7/2000 | Toyomura et al. |
| 6,114,046 A | 9/2000 | Hanoka |
| 6,121,542 A | 9/2000 | Shiotsuka et al. |
| 6,132,585 A | 10/2000 | Midorikawa et al. |
| 6,184,457 B1 | 2/2001 | Tsuzuki et al. |
| 6,184,458 B1 | 2/2001 | Murakami et al. |
| 6,231,732 B1 | 5/2001 | Hollars et al. |
| 6,232,544 B1 | 5/2001 | Takabayashi |
| 6,248,948 B1 | 6/2001 | Nakagawa |
| 6,335,479 B1 | 1/2002 | Yamada et al. |
| 6,365,010 B1 | 4/2002 | Hollars |
| 6,372,538 B1 | 4/2002 | Wendt et al. |
| 6,479,744 B1 | 11/2002 | Tsuzuki et al. |
| 6,488,824 B1 | 12/2002 | Hollars et al. |
| 6,531,653 B1 | 3/2003 | Glenn et al. |
| 6,548,912 B1 | 4/2003 | Graff et al. |
| 6,600,100 B2 | 7/2003 | Ho et al. |
| 6,657,119 B2 * | 12/2003 | Lindquist ............ H01G 9/2081 136/251 |
| 6,743,524 B2 | 6/2004 | Schaepkens |
| 6,803,513 B2 | 10/2004 | Beernink et al. |
| 6,974,976 B2 | 12/2005 | Hollars |
| 7,122,398 B1 | 10/2006 | Pichler |
| 7,544,884 B2 | 6/2009 | Hollars |
| 8,138,413 B2 | 3/2012 | Luch et al. |
| 8,142,601 B2 | 3/2012 | Sugimoto |
| 8,356,324 B2 | 1/2013 | Rajakarunanayake |
| 8,356,640 B1 | 1/2013 | Nizenkoff et al. |
| 8,912,429 B2 | 12/2014 | Wudu et al. |
| 8,951,824 B1 | 2/2015 | Krajewski |
| 9,061,344 B1 | 6/2015 | Mckay et al. |
| 9,620,660 B2 | 4/2017 | Wudu et al. |
| 9,647,160 B2 | 5/2017 | Krajewski |
| 2002/0014262 A1 | 2/2002 | Matsushita et al. |
| 2002/0166580 A1 * | 11/2002 | Bauman ............ H01L 31/048 136/244 |
| 2004/0063320 A1 | 4/2004 | Hollars |
| 2004/0069340 A1 | 4/2004 | Luch |
| 2004/0118448 A1 | 6/2004 | Scher et al. |
| 2004/0144043 A1 | 7/2004 | Stevenson et al. |
| 2004/0187917 A1 | 9/2004 | Pichler |
| 2005/0072461 A1 | 4/2005 | Kuchinski et al. |
| 2005/0074915 A1 | 4/2005 | Tuttle et al. |
| 2005/0109392 A1 | 5/2005 | Hollars |
| 2005/0176270 A1 | 8/2005 | Luch |
| 2005/0241692 A1 * | 11/2005 | Rubin ............ H01L 31/022425 136/256 |
| 2005/0274408 A1 | 12/2005 | Li et al. |
| 2005/0284517 A1 | 12/2005 | Shinohara |
| 2006/0032752 A1 | 2/2006 | Luch |
| 2006/0180195 A1 | 8/2006 | Luch |
| 2006/0207646 A1 | 9/2006 | Terreau |
| 2007/0283996 A1 | 12/2007 | Hachtmann et al. |
| 2007/0283997 A1 | 12/2007 | Hachtmann et al. |
| 2007/0295385 A1 | 12/2007 | Sheats et al. |
| 2007/0295390 A1 | 12/2007 | Sheats et al. |
| 2008/0000518 A1 | 1/2008 | Basol |
| 2008/0011350 A1 | 1/2008 | Luch |
| 2008/0053511 A1 | 3/2008 | Nakamura |
| 2008/0053519 A1 | 3/2008 | Pearce et al. |
| 2008/0128018 A1 | 6/2008 | Hayes |
| 2008/0142071 A1 | 6/2008 | Dorn et al. |
| 2008/0213477 A1 | 6/2008 | Zindel et al. |
| 2008/0314432 A1 | 12/2008 | Paulson et al. |
| 2008/0314433 A1 | 12/2008 | Luch |
| 2009/0014049 A1 | 1/2009 | Gur et al. |
| 2009/0014057 A1 | 1/2009 | Croft et al. |
| 2009/0014058 A1 | 1/2009 | Croft et al. |
| 2009/0111206 A1 | 4/2009 | Luch |
| 2009/0199894 A1 | 8/2009 | Hollars et al. |
| 2009/0235979 A1 | 9/2009 | Wudu et al. |
| 2009/0297803 A1 | 12/2009 | Kriha et al. |
| 2010/0043863 A1 | 2/2010 | Wudu et al. |
| 2010/0108122 A1 | 5/2010 | Everson et al. |
| 2010/0122730 A1 | 5/2010 | Corneille et al. |
| 2010/0130348 A1 | 5/2010 | Kang et al. |
| 2010/0212733 A1 | 8/2010 | Schmidt et al. |
| 2011/0143077 A1 | 6/2011 | Kakihara et al. |
| 2011/0197947 A1 | 8/2011 | Croft et al. |
| 2011/0207328 A1 | 8/2011 | Speakman |
| 2012/0000510 A1 | 1/2012 | Wiedeman et al. |
| 2012/0080079 A1 | 4/2012 | Corneille et al. |
| 2012/0125393 A1 | 5/2012 | Austin et al. |
| 2012/0138117 A1 | 6/2012 | Krajewski |
| 2013/0276855 A1 | 10/2013 | Wudu et al. |
| 2015/0136199 A1 | 5/2015 | Wudu et al. |
| 2016/0056319 A1 | 2/2016 | Hachtmann et al. |
| 2016/0190369 A1 | 6/2016 | Krajewski |
| 2017/0047464 A1 | 2/2017 | Krajewski |
| 2017/0288078 A1 | 10/2017 | Wudu et al. |

FOREIGN PATENT DOCUMENTS

| | | | |
|---|---|---|---|
| CA | 2718518 | 9/2009 | |
| DE | 2757301 | 7/1979 | |
| DE | 2757301 A1 * | 7/1979 | ....... H01L 31/03928 |
| DE | 2919041 | 11/1980 | |
| DE | 10393252 T5 | 9/2005 | |
| EP | 0440869 | 8/1991 | |
| EP | 0949686 | 10/1999 | |
| EP | 1868250 | 5/2010 | |
| JP | 60128647 A | 7/1985 | |
| JP | 06-021501 | 1/1994 | |

(56) References Cited

FOREIGN PATENT DOCUMENTS

| | | |
|---|---|---|
| JP | 07-099334 | 4/1995 |
| JP | 09-036404 | 2/1997 |
| JP | 10-093125 | 4/1998 |
| JP | 2000-269531 | 9/2000 |
| JP | 2004-253475 | 9/2004 |
| JP | 2005-129773 | 5/2005 |
| JP | 2006-041351 | 2/2006 |
| KR | 10-1999-006965 | 1/1999 |
| KR | 10-0242852 | 2/2000 |
| WO | 2007/116806 | 10/2007 |
| WO | 2009/117233 | 9/2009 |
| WO | 2010/056803 | 5/2010 |
| WO | 2012/047553 | 4/2012 |

OTHER PUBLICATIONS

U.S. Office Action dated Sep. 29, 2015 in U.S. Appl. No. 13/850,976.
U.S. Appl. No. 13/850,976, Final Office Action dated Jun. 6, 2016.
U.S. Appl. No. 14/539,876, Non-Final Office Action dated Sep. 7, 2017.
Office Action dated Oct. 1, 2015, in U.S. Appl. No. 12/897,162.
Final Office Action dated Jul. 8, 2016, in U.S. Appl. No. 12/897,162.
Office Action dated Jan. 13, 2017, in U.S. Appl. No. 12/897,162.
Final Office Action dated Jul. 28, 2017, in U.S. Appl. No. 12/897,162.
U.S. Office Action dated Jun. 2, 2016, in U.S. Appl. No. 14/616,978.
U.S. Final Office Action dated Oct. 26, 2016, in U.S. Appl. No. 14/616,978.
U.S. Notice of Allowance dated Jan. 6, 2017, in U.S. Appl. No. 14/616,978.
U.S. Appl. No. 11/451,616, "Photovoltaic module with integrated current collection and interconnection", Hachtmann et al., filed Jun. 13, 2006.
U.S. Office Action dated Oct. 2, 2015 in U.S. Appl. No. 11/451,616.
U.S. Office Action dated Mar. 10, 2016 in U.S. Appl. No. 11/451,616.
U.S. Office Action dated Oct. 5, 2016, in U.S. Appl. No. 11/451,616.
U.S. Office Action dated Jun. 2, 2017, in U.S. Appl. No. 11/451,616.
U.S. Office Action dated Jan. 26, 2016, in U.S. Appl. No. 14/932,059.
U.S. Office Action dated Aug. 26, 2016, in U.S. Appl. No. 14/932,059.
U.S. Office Action dated Sep. 14, 2016, in U.S. Appl. No. 14/932,059.
U.S. Office Action dated Jun. 21, 2017, in U.S. Appl. No. 14/932,059.
U.S. Office Action dated Jan. 22, 2016, in U.S. Appl. No. 11/451,604.
U.S. Office Action dated Jul. 29, 2016, in U.S. Appl. No. 11/451,604.
U.S. Office Action dated Apr. 21, 2017, in U.S. Appl. No. 11/451,604.
EP Application 09721573.5, Extended Search Report dated Jul. 23, 2015.
CA Office Action dated Jan. 13, 2016, in Application No. 2,718,518.
Partial EP Search Report dated Jul. 10, 2008, issued in Application No. 07252359.0.
EP Extended Search Report dated Aug. 11, 2015, Issue in Application No. 072523359.0.
CA Office Action and Examination Search Report dated Jun. 5, 2015, in Application No. 2,718,518.
EP Application No. 07252359.0, Search Opinion dated Apr. 14, 2010, with letter dated Jul. 13, 2010.
DuPont Surlyn Resin Product Data Sheet. Accessed Jun. 30, 2016: Http://www.dupont.com/content/dam/dupont/products-and-services/packaging-materials-and-solutions/packaging-materials-and-soulutions-landing/documents/surlyn_1652.pdf.

U.S. Appl. No. 15/473,476, filed Mar. 27, 2017, Wudu et al.
U.S. Office Action dated Aug. 8, 2016, in U.S. Appl. No. 13/087,730.
U.S. Final Office Action dated Feb. 1, 2017, in U.S. Appl. No. 13/087,730.
Richards et al "Enhancing the efficiency of production CdS/CdTe PV modules by overcoming poor spectral response at short wavelengths via luminescence down-shifting," 2006 IEEE 4th World Conference on Photovoltaic Energy Conversion, May 7-12, 2006, 4 pages.
Untila et al., "19.2% Efficient Bifacial ITO-(P+Nn+)Si-ITO Laminated Grid Cell", 16th European Photovoltaic Solar Energy Conference, May 1-5, 2000, Glasgow, UK, pp. 1489-1491.
U.S. Appl. No. 11/451,604, Final Office Action dated Apr. 1, 2010.
U.S. Appl. No. 11/451,604, Office Action dated Sep. 4, 2009.
EP patent application No. 07252359.0, Examination Report dated Jul. 10, 2008.
U.S. Appl. No. 12/052,476, "Interconnect assembly," Zerfu et al., filed Mar. 20, 2008.
WO patent application No. PCT/US2009/035486, International Search Report and Written Opinion, dated Sep. 29, 2009.
U.S. Appl. No. 12/566,555, "Interconnect Assembly", Wudu et al., filed Sep. 24, 2009.
U.S. Appl. No. 12/272,600, "Power-loss-inhibiting current-collector", Corneille et al., filed Nov. 17, 2008.
U.S. Appl. No. 12/837,867, "Transparent conductive film-coated decals for solar cells", Corneille et al., filed Jul. 16, 2010.
U.S. Appl. No. 12/819,124, "Power-loss-inhibiting current collector having transparent current regulator", Corneille et al., filed Jun. 18, 2010.
U.S. Appl. No. 12/843,648, "Temperature resistant current collectors for thin film photovoltaic cells", Alex Austin, filed Jul. 26, 2010.
U.S. Appl. No. PCT/US2009/064125, International Search Report and Written Opinion, dated May 24, 2010.
U.S. Appl. No. 12/272,600, Office Action dated Apr. 14, 2011.
U.S. Appl. No. 12/897,162, "Small gauge wire solar cell interconnect", Corneille et al., filed Oct. 4, 2010.
U.S. Appl. No. 12/052,476, Office Action dated Jan. 21, 2011.
U.S. Appl. No. 12/052,476, Office Action dated Aug. 3, 2011.
U.S. Appl. No. 12/272,600, Office Action dated Oct. 18, 2011.
U.S. Appl. No. 12/687,754, "Apparatuses and methods for fabricating wire current collectors and interconnects for solar cells," Nizenkoff et al., filed Jan. 14, 2010.
U.S. Appl. No. 12/915,882, "Apparatus and method for securing wire to decal," McKay et al., filed Oct. 29, 2010.
U.S. Appl. No. 13/082,709, "Adhesives for attaching wire network to photovoltaic cells," Todd Krajewski, filed Apr. 8, 2011.
U.S. Appl. No. 13/085,274, "Thermoplastic wire network support for photovoltaic cells," Todd Krajewski, Apr. 12, 2011.
U.S. Appl. No. 13/087,724, "Wire network for interconnecting photovoltaic cells," Steven Croft, filed Apr. 15, 2011.
U.S. Appl. No. 13/087,730, "Interconnecting wire network with conductive tab," Steven Croft, filed Apr. 15, 2011.
U.S. Appl. No. 11/451,616, Office Action dated Sep. 17, 2009.
U.S. Appl. No. 11/451,616, Final Office Action dated Apr. 20, 2010.
U.S. Appl. No. 12/951,711, "Photovoltaic Device and Method and System for Making Photovoltaic Device," Austen, filed Nov. 22, 2010.
U.S. Appl. No. 12/052,476, Office Action dated Mar. 16, 2012.
U.S. Appl. No. 12/052,476, Notice of Allowance dated Jul. 18, 2012.
U.S. Appl. No. 12/566,555, Office Action dated Feb. 16, 2012.
U.S. Appl. No. 13/114,999, "Apparatuses and Methods for Fabricating wire Current Collectors and Interconnects for Solar Cells," McKay et al., filed May 24, 2011.
U.S. Appl. No. 12/915,882, Office Action dated Jul. 20, 2012.
International Search Report and Written Opinion dated Apr. 24, 2012 for application No. PCT/US2011/052974.
U.S. Appl. No. 12/837,867, Office Action dated Aug. 8, 2012.
U.S. Appl. No. 12/566,555, Office Action dated Sep. 28, 2012.
U.S. Appl. No. 12/819,124, Office Action dated Oct. 9, 2012.
U.S. Appl. No. 12/272,600, Office Action dated Oct. 10, 2012.

(56) References Cited

OTHER PUBLICATIONS

U.S. Appl. No. 12/052,476, Office Action dated May 31, 2013.
U.S. Appl. No. 13/850,976, "Interconnect Assembly," Wudu et al., filed Mar. 26, 2013.
Notice of Allowance dated Sep. 18, 2012, for U.S. Appl. No. 12/687,754.
Office Action dated Dec. 6, 2012, for U.S. Appl. No. 12/843,648.
Shimomura, JP 2006-041351A, Machine Translation.
Office Action dated Jun. 7, 2013 for U.S. Appl. No. 12/897,162.
Huisman, et al., "The application of inverse titania opals in nanostructured solar cells," Jun. 1, 2004, Elsevier, Solar Energy Material & Solar Cells, 85 (2005), pp. 115-124.
Reynolds, Phillip John, "A Surly Ionomer as a self-healing and self-sensing composite," Dec. 2011, University of Bomingham, p. 10.
Sigma-Aldrich, Material Safety Data Sheet Poly (ethylene terephthalate), Dec. 18, 2012, Sigma-Aldrich, Version 4.2.
Sigma-Aldrich, Material Safety Data Sheet Poly (ethylene-co-matheacryilic acid), Jul. 20, 2010, Sigma-Aldrich, Version 4.0.
U.S. Office Action dated Aug. 1, 2013, issued in U.S. Appl. No. 13/085,274.
Kay, et al. Low Cost Photovoltaic Modules Based on Dye Sensitized Nanocrystalline Titanium Dioxide and Carbon Powder, Solar Energy Materials and Solar Cells, 1996, 19 pages.
DuPont, Teflon FEP 100 Material Safety Data Sheet, 2013, 2 pages.
U.S. Appl. No. 13/082,709, Office Action dated Nov. 1, 2013.
U.S. Appl. No. 13/087,724, Office Action dated Nov. 6, 2013.
U.S. Appl. No. 12/052,476, Office Action dated Feb. 7, 2014.
U.S. Appl. No. 13/085,274, Office Action dated Apr. 11, 2014.
U.S. Appl. No. 12/052,476, Office Action dated May 2, 2014.
U.S. Appl. No. 12/687,754, Notice of Allowance dated Sep. 18, 2012.
U.S. Appl. No. 13/087,724, Final Office Action dated Jun. 12, 2014.
U.S. Appl. No. 13/082,709, Office Action dated Jun. 17, 2014.
U.S. Appl. No. 12/052,476, Notice of Allowance dated Aug. 14, 2014.
U.S. Appl. No. 13/114,999, Office Action dated Jul. 24, 2014.
Final Office Action dated Sep. 5, 2014 for U.S. Appl. No. 12/897,162.
U.S. Appl. No. 13/087,730, Office Action dated Jun. 25, 2014.
U.S. Appl. No. 11/451,616, Office Action dated Jun. 6, 2014.
U.S. Appl. No. 11/451,604, Office Action dated Jun. 6, 2014.
U.S. Appl. No. 14/539,876, "Interconnect Assembly," Wudu et al., filed Nov. 12, 2014.
U.S. Appl. No. 13/082,709, Notice of Allowance dated Oct. 6, 2014.
U.S. Appl. No. 13/085,274, Office Action dated Dec. 26, 2014.
U.S. Appl. No. 13/087,730, Office Action dated Feb. 5, 2015.
U.S. Appl. No. 14/616,978, "Adhesives for attaching wire network to photovoltaic cells," Todd Krajewski, filed Feb. 9, 2015.
U.S. Appl. No. 11/451,616, Final Office Action dated Feb. 2, 2015.
U.S. Appl. No. 13/850,976, "Interconnect Assembly," Wudu et al., filed Mar. 27, 2013.
U.S. Appl. No. 13/114,999, Notice of Allowance dated Feb. 20, 2015.
U.S. Final Office Action dated Jul. 22, 2015, issued in U.S. Appl. No. 13/085,274.
U.S. Appl. No. 15/243,622, Office Action dated Apr. 11, 2018.
U.S. Non-Final Office Action dated Oct. 24, 2017, in U.S. Appl. No. 14/932,059.
U.S. Office Action dated Apr. 5, 2018, in U.S. Appl. No. 11/451,604.

\* cited by examiner

WIRE NETWORK FOR INTERCONNECTING PHOTOVOLTAIC CELLS

CROSS-REFERENCE TO RELATED APPLICATIONS

This application is a divisional of and claims priority to U.S. patent application Ser. No. 13/087,724, titled "WIRE NETWORK FOR INTERCONNECTING PHOTOVOLTAIC CELLS," filed Apr. 15, 2011, which is a continuation-in-part of U.S. patent application Ser. No. 12/566,555, titled "INTERCONNECT ASSEMBLY," filed Sep. 24, 2009, which is a continuation-in-part of U.S. patent application Ser. No. 12/052,476, titled "INTERCONNECT ASSEMBLY," filed Mar. 20, 2008, all of which are incorporated herein by reference in their entirety for all purposes.

BACKGROUND

In the drive for renewable sources of energy, photovoltaic technology has assumed a preeminent position as a cheap and renewable source of clean energy. For example, photovoltaic cells using a Copper Indium Gallium Diselenide (CIGS) absorber layer offer great promise for thin-film photovoltaic cells having high efficiency and low cost. Of comparable importance to the technology used to fabricate thin-film cells themselves is the technology used to collect electrical current from the cells and to interconnect one photovoltaic cell to another to form a photovoltaic module.

Just as the efficiency of thin-film photovoltaic cells is affected by parasitic series resistances, photovoltaic modules fabricated from multiple cells are also impacted by parasitic series resistances and other factors caused by electrical connections to the absorber layer and other electrical connections within the modules. A significant challenge is the development of current collection and interconnection structures that improve overall performance of the module. Moreover, the reliability of photovoltaic modules is equally important as it determines their useful life, cost effectiveness, and viability as reliable alternative sources of energy.

SUMMARY

Provided are novel interconnect wire network assemblies and methods of fabricating thereof. An assembly may include conductive portions/individual wires that, in certain embodiments, are substantially parallel to each other. The assembly also includes two or more carrier films (i.e., the front side and back side films) attached to opposite sides of the wires. The films are typically attached along the wire ends. The films are made from electrically insulating materials and at least the front side film is substantially transparent. The front side film is used to attach the wires to a photovoltaic surface of one cell, while the back side film is used for attachment to a substrate surface of another cell. These attachments electrically interconnect the two cells in series. In certain embodiments, one or both carrier films extend beyond two end wires and form insulated portions that allow much closer arrangements of the cells in a module.

In certain embodiments, an interconnect wire network assembly includes a plurality of conductive portions extending substantially parallel to each other, a first carrier film having a first substantially transparent electrically insulating layer, and a second carrier film having a second substantially transparent electrically insulating layer. The plurality of conductive portions having a first set of ends defining a first edge and a second set of ends defining a second edge. The plurality of conductive portions is configured for current collection from a front side surface of a first photovoltaic cell and electrical connection with a back side surface of a second photovoltaic cell. The first carrier film is coupled to the plurality of conductive portions along the first edge and configured to attach the plurality of conductive portions to the front side surface of the first photovoltaic cell to form a first electrical connection between the front side surface and the plurality of conductive portions. The second carrier film is coupled to the plurality of conductive portions along the second edge and configured to attach the plurality of conductive portions to the back side surface of the second photovoltaic cell to form a second electrical connection between the back side surface and the plurality of conductive portions.

In certain embodiments, a first carrier film is positioned on another side of the conductive portions with respect to the second carrier film. The two films may overlap. In other embodiments, the two films may be positioned at a predetermined distance from the second carrier film. An outside edge of the first carrier film may substantially coincide with the first edge of the plurality of conductive portions. In other embodiments, the first carrier film extends past the first edge of the conductive portions. In certain embodiments, conductive portions extend past two edges of the first carrier film.

One or both carrier films may be made from one or more of the following materials: polyethylene terephthalate, polyethylene co-methacrylic acid, polyamide, and polyetheretherketone. In the same or other embodiments, conductive portions may be made from one or more of the following materials: copper, aluminum, nickel, and chrome. Conductive portions may include multiple individual wires. These individual wires may be between 24 gauge and 56 gauge. The individual wires may be spaced apart by between about 2 millimeters and about 5 millimeters. Each wire may be electrically insulated from other wires prior to attaching the interconnect wire network assembly to the first photovoltaic cell or the second photovoltaic cell. In certain embodiments, multiple individual wires have a strip of foil attached to the second edge and electrically interconnecting the multiple individual wires.

In certain embodiments, the first carrier film extends past two end wires of the plurality of conductive portions forming two side insulating regions. The first carrier film may extend past and folds over two end conductive portions of the plurality of conductive portions, forming insulating shells around the two end conductive portions.

Provided also a method of fabricating an interconnect wire network assembly. The method involves unwinding multiple individual wires from corresponding multiple wire rolls, extending the wires along an unwinding direction substantially parallel to each other at a predetermined distance from each other, applying a first carrier film onto the first surface of the wires, and applying a second carrier film onto the second surface of the wires. The two first carrier films may be applied substantially perpendicular to the unwinding direction. Applying the first carrier film may involve passing an electric current through a portion of the multiple individual wires that is in contact with the first carrier film in order to heat this portion.

The method may also involve forming a roll of interconnect wire network subassemblies, unwinding the roll of interconnect wire network subassemblies, and cutting the multiple individual wires substantially perpendicular to the multiple individual wires to form the interconnect wire network assembly. In certain embodiments, the method involves cutting the multiple individual wires substantially perpendicular to the multiple individual wires to form the interconnect wire network assembly. Such cutting may also involve cutting the first carrier film or the second carrier film.

Provided also a photovoltaic module that includes a first photovoltaic cell having a front side surface, a second photovoltaic cell having a back side surface, and an interconnect wire network assembly. The assembly may include a plurality of conductive portions extending substantially parallel to each other and in electrical communication with the front side of the first photovoltaic cell and the back side of the second photovoltaic cell. The assembly also includes a first carrier film coupled to the plurality of conductive portions along the first edge and attaching the plurality of conductive portions to the front side surface of the first photovoltaic cell. Furthermore, the assembly includes a second carrier film coupled to the plurality of conductive portions along the second edge and attaching the plurality of conductive portions to the back side surface of the second photovoltaic cell. The conductive portions include a first set of ends defining the first edge and a second set of ends defining the second edge. The first carrier film is made from a first substantially transparent electrically insulating layer, while the second carrier film is made from a second substantially transparent electrically insulating layer.

These and other embodiments are described further below with reference to the figures.

DETAILED DESCRIPTION OF EXAMPLE EMBODIMENTS

In the following description, numerous specific details are set forth in order to provide a thorough understanding of the present invention. The present invention may be practiced without some or all of these specific details. In other instances, well known process operations have not been described in detail so as to not unnecessarily obscure the present invention. While the invention will be described in conjunction with the specific embodiments, it will be understood that it is not intended to limit the invention to the embodiments.

Figure 1:
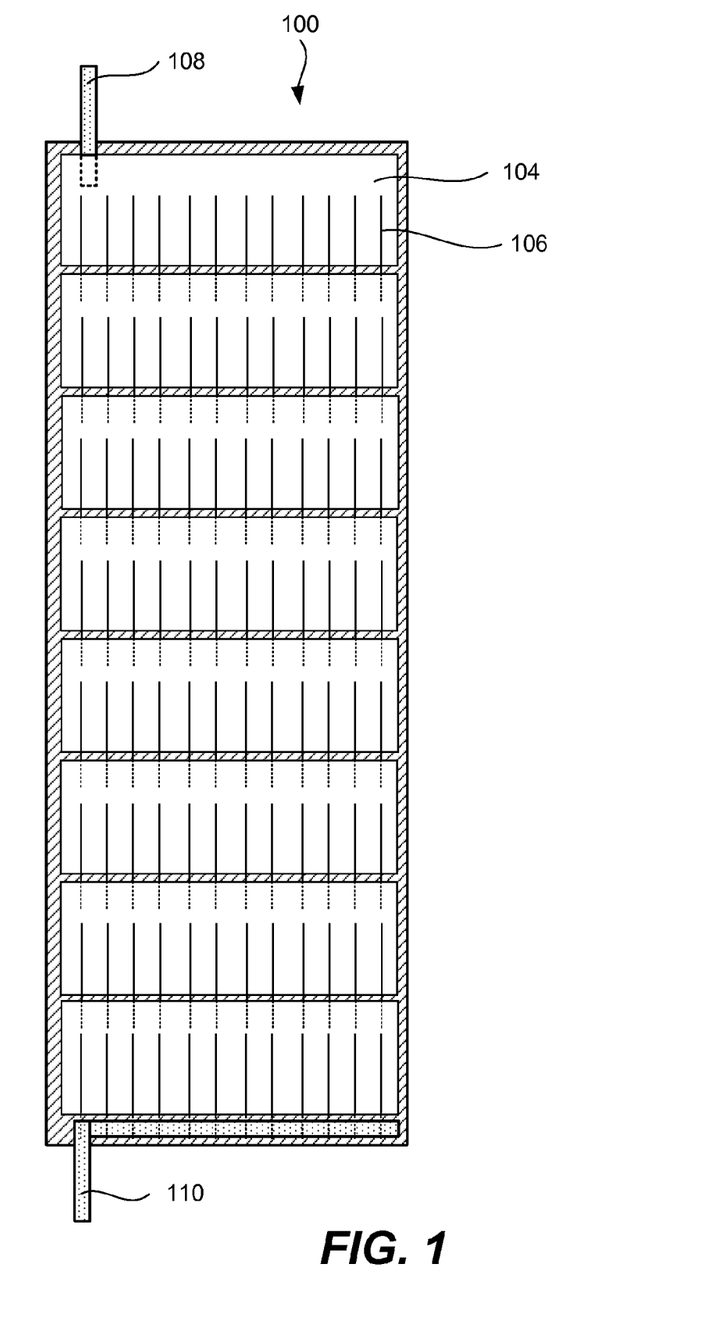
FIG. 1 is a schematic representation of a photovoltaic module having multiple photovoltaic cells electrically interconnected with each other using interconnect wire network assemblies, in accordance with certain embodiments.

To provide a better understanding and context for the description of various features of interconnect wire network assemblies, an example of a photovoltaic module will now be described. FIG. 1 is a schematic representation of a photovoltaic module 100 having multiple photovoltaic cells 104, in accordance with certain embodiments. Photovoltaic cells 104 are electrically interconnected in series using multiple interconnect wire network assemblies 106. Specifically, each pair of cells 104 is interconnected using one assembly 106. FIG. 1 shows eight photovoltaic cells interconnected with seven assemblies; however, it will be understood that any number of cells may be used in a module. In certain embodiments, a module includes at least 10 cells or, more specifically, at least 15 cells interconnected in series. In particular embodiments, a module includes 22 cells interconnected in series. Furthermore, one set of cells interconnected using wire network assemblies may be further connected to one or more similar sets in the same module. For example, a module may include two sets, each set including 22 interconnected cells. The connections between the sets may be provided by wire network assemblies or other components.

Multiple cells may be interconnected in series when individual cells do not provide an adequate output voltage. The output voltage requirement may be driven by electrical current transmission and other factors. For example, a typical voltage output of an individual CIGS cell is between 0.4V and 0.7V. A module built from CIGS cells is often designed to provide a voltage output of at least about 20V or even higher. In addition to interconnecting multiple cells in series, a module may include one or more module-integrated inverters. Interconnect wire network assemblies 106 may be also used to provide uniform current distribution and collection from one or both contact layers, as further explained below. It should be understood that these assemblies may also be used to provide parallel electrical connections or a combination of in-series and parallel connections.

As shown in FIG. 1, each interconnect wire network assembly 106 (with the exception of the bottom assembly, which is further described above) extends over a front side of one cell and under a back side of another cell. One or both cells in this pair may be connected to other cells and so on. As such, most cells may have one interconnect wire network assembly extending over its front side and another interconnect wire network assembly extending under its back side. An end cell in the set (e.g., the top-most cell in FIG. 1) may have only one interconnect wire network assembly extending over one of its surfaces, typically over the front side. In this embodiment, a bus bar 108 may be connected directly to the cell (i.e., to its back side). In some embodiments, an end cell (e.g., the bottom-most cell in FIG. 1) may still have two interconnect wire network assemblies. A bus bar 110 may be attached to one of these assemblies. Specifically, bus bar 110 may be attached to a portion of the interconnect wire network assembly extending outside of the cell perimeter. Such attachment may involve welding, soldering, and other forms of attachments, which are generally not suitable for attachment directly to the cells.

When an interconnect wire network assembly extends over a front side of the photovoltaic cell, it makes an electrical connection with that side or, more specifically, with a top layer arranged on that side. In certain embodiments, a photovoltaic cell includes one or more transparent conductive oxides (TCO), such as zinc oxide, aluminum-doped zinc oxide (AZO), indium tin oxide (ITO), and gallium doped zinc oxide, disposed over the front side of the photovoltaic cell. A typical thickness of a top conductive layer is between about 100 nanometers to 1,000 nanometers (for example between about 200 nanometers and 800 nanometers), with other thicknesses within the scope. The TCO provides an electrical connection between the entire photovoltaic layer and a portion of the interconnect wire network assembly extending over the front side of the cell. Due to the limited conductivity of the TCO layer, the interconnect wire network assembly typically extends uniformly over the entire front side surface of the cell and provides uniform current distribution and collection from this surface. As such, an interconnect wire network assembly is sometimes referred to as a current collector. Various characteristics of interconnect wire network assemblies allowing uniform current distribution and collection are described below in the context of FIG. 2.

An interconnect wire network assembly extending under a back side of the cell makes an electrical connection with that side or more specifically with a conductive substrate supporting the photovoltaic stack. Some examples of photovoltaic stacks include CIGS cells, cadmium-telluride (Cd—Te) cells, amorphous silicon (a-Si) cells, micro-crystalline silicon cells, crystalline silicon (c-Si) cells, gallium arsenide multi-junction cells, light adsorbing dye cells, and organic polymer cells. Some examples of conductive substrates include stainless steel foil, titanium foil, copper foil, aluminum foil, beryllium foil, a conductive oxide deposited over a polymer film (e.g., polyamide), a metal layer deposited over a polymer film, and other conductive structures and materials. In certain embodiments, a conductive substrate has a thickness of between about 2 mils and 50 mils (e.g., about 10 mils), with other thicknesses also within the scope. Generally, a substrate is sufficiently conductive such that a uniform and extensive distribution of interconnect wire network assembly wires is not needed for uniform current collection on this side. As such, a portion of the wire network assembly extending under the back side of one cell may be smaller than a corresponding portion extending over a front side of an adjacent cell.

As shown in FIG. 1 and further explained below with reference to FIG. 2, interconnect wire network assemblies may include conductive portions, such as multiple individual wires, extending substantially parallel to each other. When installed into the module, conductive portions extend under photovoltaic cells and are illustrated with dashed line in FIG. 1. The other part of the conductive portions extends over front sides of adjacent cells and is shown with solid lines. When cells are spaced apart as shown in FIG. 1, a part of the conductive portions extends between the cells. In other embodiments, cells in the module may be adjacent to each other (e.g., have a minimal or no gap) or even overlap (sometimes referred to as a "shingle" arrangement). Interconnect wire network assemblies also have insulating carrier films, which allow various insulation schemes that in turn allow these various cell arrangements, as will be now described in more detail.

Figure 2:
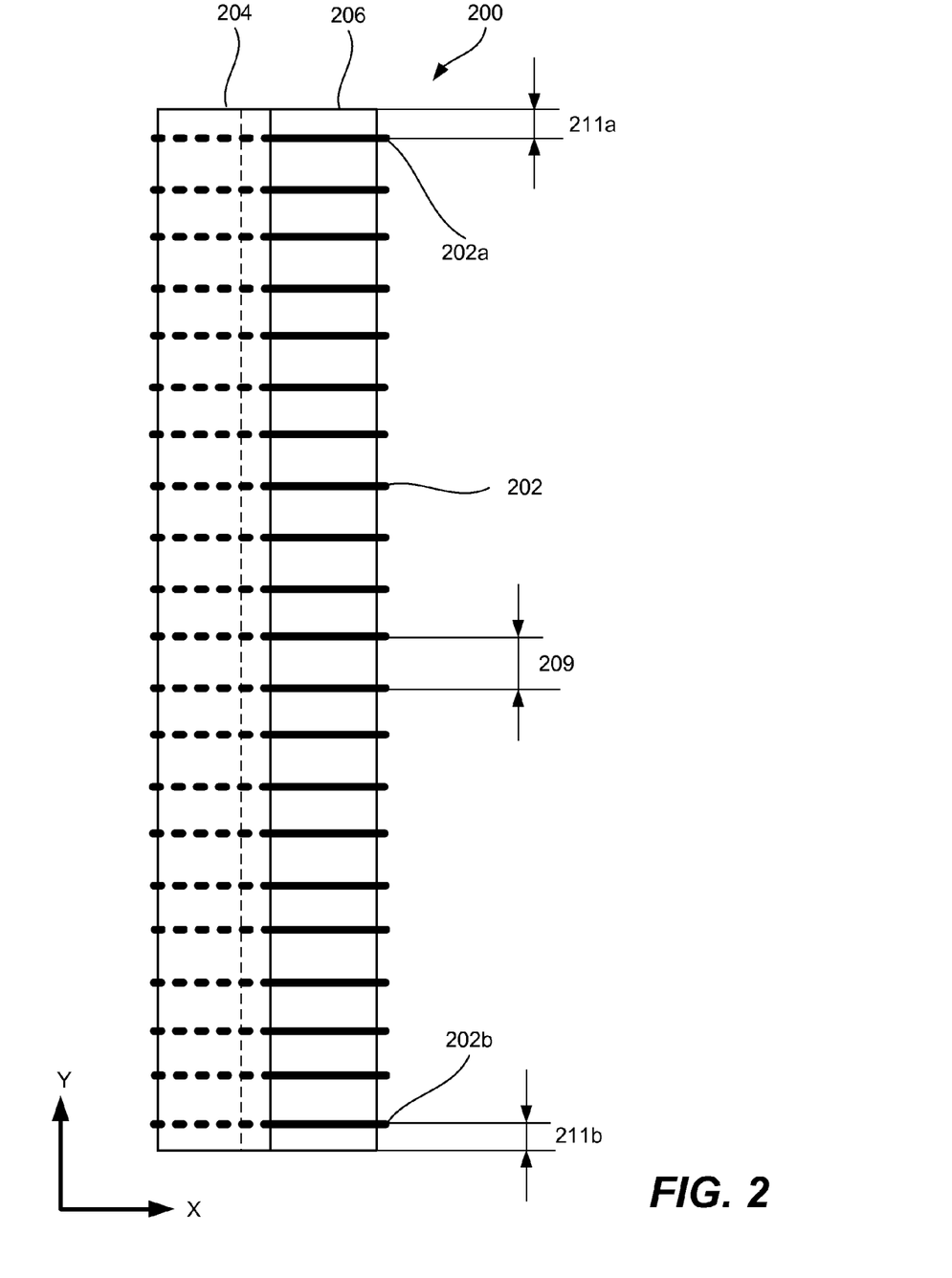
FIG. 2 is a schematic top view of an interconnect wire network assembly, in accordance with certain embodiments.

FIG. 2 is a schematic top view of an interconnect wire network assembly 200, in accordance with certain embodiments. Assembly 200 includes conductive portions 202 and two carrier films (i.e., a first carrier film 204 and a second carrier film 206). Since these films 204, 206 are cut to a predetermined length, these films 204, 206 may be also referred to as carrier strips or decals. A portion of conductive portions 202 extends under first carrier film 204 from the top view perspective presented in FIG. 2. As such, this portion is shown with dashed lines. In certain embodiments, conductive portions 202 include multiple individual wires continuously extending between two edges (i.e., the first edge and the second edge) defined by ends of the wires along direction X. In certain embodiments, these wires extend substantially parallel to each other. Specifically, an angle between any pair of adjacent wires may be less than about 5° or, more specifically, less than about 1°. However, wires may extend in other directions and/or cross-over.

Substantially parallel wires are shown in FIG. 2 and may be arranged and spaced apart along the length of assembly 200, or direction Y. This arrangement may be characterized by a pitch 209, which, for purposes of this document, is defined as a distance between the centers of two adjacent wires. The pitch determines the distance an electrical current travels through the conductive top layer of the cell prior to reaching more conductive wires of the interconnect wire network assembly 200. Reducing the pitch increases the current collection characteristics of assembly 200. However, a smaller pitch also decreases the useful surface area of the cell by covering the photovoltaic layer with non-transparent wires. In certain embodiments, pitch 209 is between about 2 millimeters and 5 millimeters (e.g., about 3.25 millimeters), although other distances may be used, as appropriate.

Conductive portions 202 are typically made from thin, highly conductive metal stock and may have round, flat, and other shapes. As mentioned above, conductive portions 202 are generally more conductive than the TCO layer and are used to improve current collection from the front surface of the cell. Examples of wire materials include copper, aluminum, nickel, chrome, or alloys thereof. In some embodiments, a nickel coated copper wire is used. In certain embodiments, the wire is 24 to 56 gauge, or in particular embodiments, 32 to 56 gauge (for example, 40 to 50 gauge). In specific embodiments, the wire has a gauge of 34, 36, 40, 42, 44, or 46. Additional wire examples are described in U.S. patent application Ser. No. 12/843,648, entitled "TEMPERATURE RESISTANT CURRENT COLLECTORS FOR THIN FILM PHOTOVOLTAIC CELLS," filed Jul. 26, 2010, which is incorporated herein by reference in its entirety for purposes of describing additional wire examples.

Carrier films 204 and 206 are coupled to conductive portions 202 along two edges defined by the ends of conductive portions 202, such as ends of wires shown in FIG. 2. These edges extend along the length of the assembly in direction Y and may be generally parallel to each other. Various positions of carrier films 204 and 206 with respect to these edges are explained below with reference to FIGS. 3A, 3B, and 3C. As noted, during fabrication of a module, one carrier film is configured to attach wires 202 to a photovoltaic surface of one photovoltaic cell and may be referred to as a top carrier film or a top decal. Another carrier film is configured to attach wires 202 to a substrate surface of another photovoltaic cell and may be referred to as a bottom carrier film or a bottom decal. Either one of carrier films 204 and 206 can be a top carrier film, while another one can be a bottom carrier film. These designations are explained in more detail with reference to FIG. 7, which shows two photovoltaic cells interconnected using an interconnect wire network assembly. The attachments provided by the carrier films form electrical connections between conductive portions 202 and the photovoltaic and substrate surfaces of two cells.

Both top and bottom carrier films are made from electrically insulating materials. The top carrier film should also be substantially transparent so as to allow the sunlight to reach the photovoltaic layer. In certain embodiments, both carrier films are substantially transparent electrically insulating layers. Some examples of suitable carrier film materials include thermoplastic materials, such as polyethylene terephthalate (PET), ionomer resins (e.g., poly(ethylene-co-methacrylic acid)), polyamide, polyetheretherketone (PEEK), or combinations of these. One particular example is SURLYN®, available from E. I. du Pont de Nemours and Company in Wilmington, Del. In certain embodiments, one or both carrier films have a layered structure. For example, a carrier film may have three polymers layers, such as a co-extruded stack containing SURLYN®, PET, and another layer of SURLYN® (with the PET layer positioned in between the two SURLYN® layers). In certain embodiments, a suitable carrier may be a thermoplastic material or materials curable using ultra violet (UV) or other techniques.

Figure 3A:
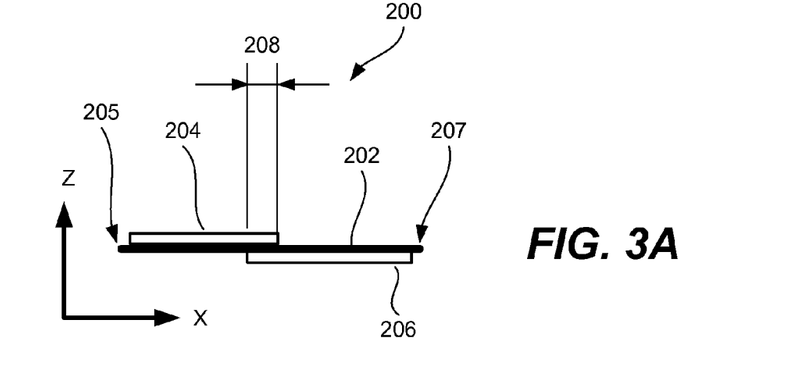
FIG. 3A is a schematic side view of an interconnect wire network assembly depicted in FIG. 2, in accordance with certain embodiments.

FIG. 3A is a schematic side view of the interconnect wire network assembly 200 depicted in FIG. 2, in accordance with certain embodiments. This side view further illustrates various arrangements of the assembly that may not be easily appreciated from the top view in FIG. 2. Specifically, FIG. 3A shows carrier films 204 and 206 attached to opposite sides of conductive portions 202. With reference to direction Z, carrier film 204 is positioned on the top side of conductive portions 202, while carrier film 206 is positioned on the bottom side of conductive portions 202. This orientation does not necessarily correspond to carrier film 204 being a top carrier film in the module assembly. In this orientation and reference, the bottom surface of carrier film 204 may be an adhesive surface and used for securing carrier film 204 to conductive portions 202. Furthermore, the same adhesive surface is used to secure carrier film 204 to the cell (e.g., to a photovoltaic surface if carrier film 204 is a top carrier film) after integration of assembly 200 into the module. Correspondingly, carrier film 206 has a top adhesive surface for securing carrier film 206 to conductive portions 202 and, after installation, to the cell (e.g., to a substrate surface if carrier film 206 is a bottom carrier film). Adhesion between the carrier films and conductive portions, during fabrication of the assembly, may be achieved by applying pressure between these components and/or heat to one or both components. These features are further described below with reference to FIG. 4.

FIG. 3A illustrates carrier films 204 and 206 forming an overlap 208 in the middle portion of assembly 200. This overlap may be used, in part, to prevent electrical shorts in the assembled module and for other purposes. At overlap 208, carrier films 204 and 206 may be adhered to each other in the areas between adjacent conductive portions and outside of end conductive portions to provide additional structural integrity to assembly 200. Further, conductive portions 202 are shown to extend past the outside edges of carrier films 204 and 206 (in direction X) and have exposed ends 205 and 207.

Figure 3B:
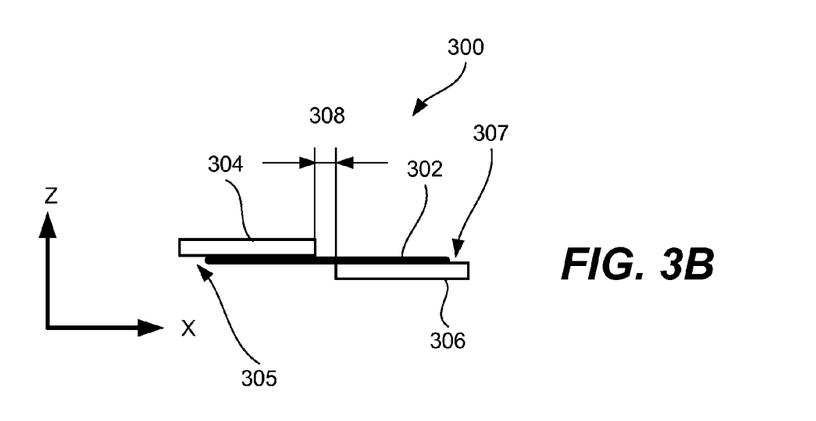
FIG. 3B is a schematic side view of another interconnect wire network assembly, in accordance with different embodiments.

Other arrangements of wires and carrier films in interconnect wire network assemblies are possible. FIG. 3B is a schematic side view of another assembly 300, in accordance with different embodiments. Carrier films 304 and 306 extend past the wire ends (in direction X) and form insulating regions or flaps 305 and 307. There may be a need to protect the ends of the wires to prevent their sharp corners from causing electrical shorts. Furthermore, carrier films 304 and 306 do not overlap in the middle portion of assembly 300. Instead carrier films 304 and 306 form a gap 308 in that portion and expose a portion of wires 302. This gap 308 may help to improve the flexibility of assembly 300 around this portion and may reduce the overall thickness of assembly 300.

Figure 3C:
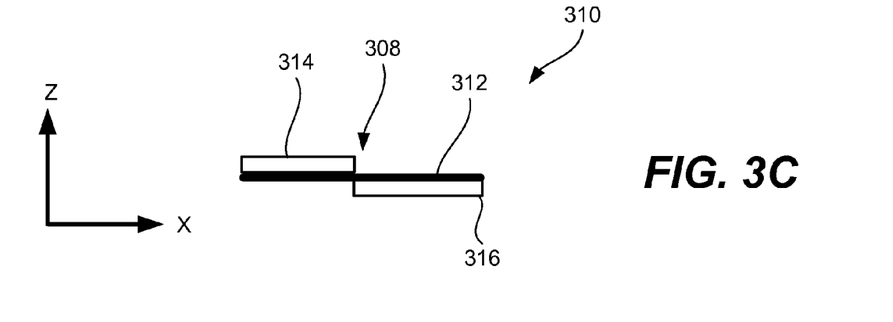
FIG. 3C is a schematic side view of yet another interconnect wire network assembly, in accordance with different embodiments.

FIG. 3C is a schematic side view of interconnect wire network assembly 310, in accordance with different embodiments. Outside edges of carrier films 314 and 316 of this assembly coincide with the ends of wires 312. This type of arrangement may be formed by cutting wires 312 together with carrier films 314 and 316 during fabrication of the assembly, as described below with reference to FIG. 6B. Furthermore, carrier films 314 and 316 do not overlap in the middle portion of the assembly. Instead, the inside edges of carrier films 314 and 316 coincide.

In general, respective positions of the carrier films' outside edges relative to the wires' ends are independent from respective positions of the inside edges. Various combinations of these respective positions are not limited to the examples presented in FIGS. 3A, 3B, and 3C and described above. Other combinations are possible (e.g., extended outside edges (as shown in FIG. 3B) combined with overlapped inner edges (as shown in FIG. 3A), a middle gap (as shown in FIG. 3B) combined with exposed wire ends (as shown in FIG. 3A), and so on).

Returning to FIG. 2, carrier films 204 and 206 are shown to extend beyond end wires 202a and 202b in Y direction. These extensions form two side insulating regions 211a and 211b, which may be referred to as insulating flaps. Insulating regions 211a and 211b do not have any conductive materials and may include only one or both carrier films. As such, insulating regions 211a and 211b can be used to insulate the edges of corresponding photovoltaic cells after fabrication of the module. For example, this insulation allows a closer arrangement of cells within a module along Y direction. It should be noted that only one carrier film may extend beyond end wires 202a and 202b to form insulating regions 211a and 211b. In certain embodiments, there is not gap between two adjacent cells (not accounting portions of the interconnect assemblies attached to these cells) in this direction. The cells may even overlap in certain embodiments. Carrier films of the interconnect assemblies may be used to insulate edges of the two adjacent cells. For example, one portion of the carrier film may be attached to the front light incident side of the first cell, while another portion may extend outside of the first cell boundary and under the back side of the adjacent cell. This extension insulated the two adjacent edges of the cells with respect to each other.

In certain embodiments, conductive portions include individual wires such that each wire is electrically insulated from other wires. For example, the wires may extend substantially parallel to each other and/or do not touch each other. One having ordinary skills in the art would understand that such wires remain electrically insulated only until attachment of the assembly to a photovoltaic cell, during which the wires become interconnected by a front side, back side, or both. In other embodiments, wires may be interconnected by a strip of foil or other wires. The interconnection may be provided along one set of wires' ends, similar to an example presented in FIG. 1. The interconnecting element (e.g., a foil strip) may then be used for connection to bus bars and/or other electrical components of the module. In certain embodiments, an interconnecting element may be used to enhance an electrical connection to a back side of the photovoltaic module.

Figure 4:
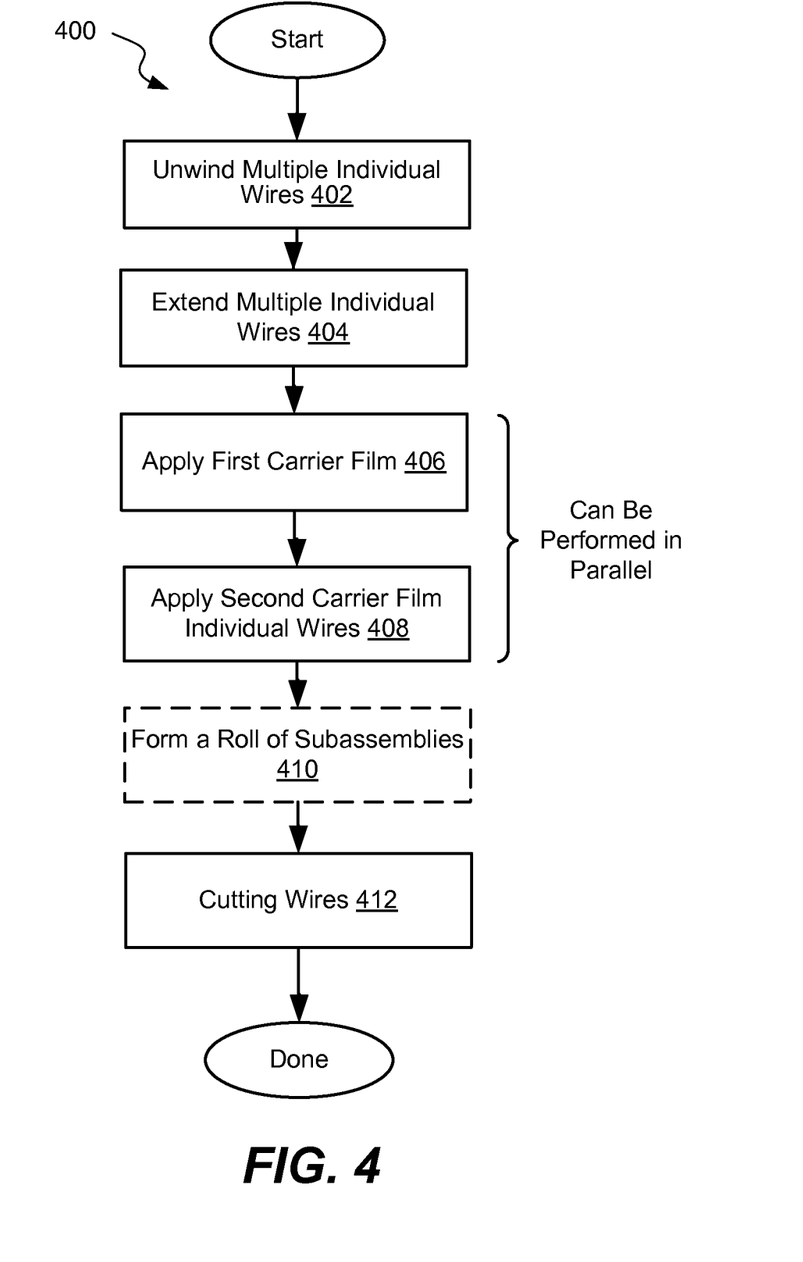
FIG. 4 illustrates a process flowchart corresponding to a method of fabricating an interconnect wire network assembly, in accordance with certain embodiments.

FIG. 4 illustrates a flowchart corresponding to a process 400 of fabricating an interconnect wire network assembly, in accordance with certain embodiments. Process 400 may start with unwinding multiple individual wires from wire rolls or spools in operation 402. In certain embodiments, multiple wires provided in operation 402 may be interconnected and provided as a woven mesh. However, it would be understood by one having ordinary skills in the art that other types of conductive portions may be used in addition or instead of individual wires. Various examples of wires are described above. The number of wires depends on a size of the assembly (and a photovoltaic cell) and a pitch between the wires. The wires may have different profiles (e.g., a round profile or a flat profile).

Process 400 may proceed with extending the wires along the same direction (i.e., "an unwinding direction") in operation 404. The wires may be substantially parallel during this operation and positioned at a predetermined distance from each other. In other embodiments, wires may be arranged in other configurations and may even overlap. During this operation, the wires may be arranged within substantially the same plane by, for example, applying a tension to the wires. In general, the multiple wires extended in this operation may be characterized as having a first surface and a second surface regardless of whether these surfaces are planar or not. These two surfaces are spaced apart by a cross-sectional dimension of the wires, such as wire diameters for round wires or wire thicknesses for flat wires.

Figure 5:
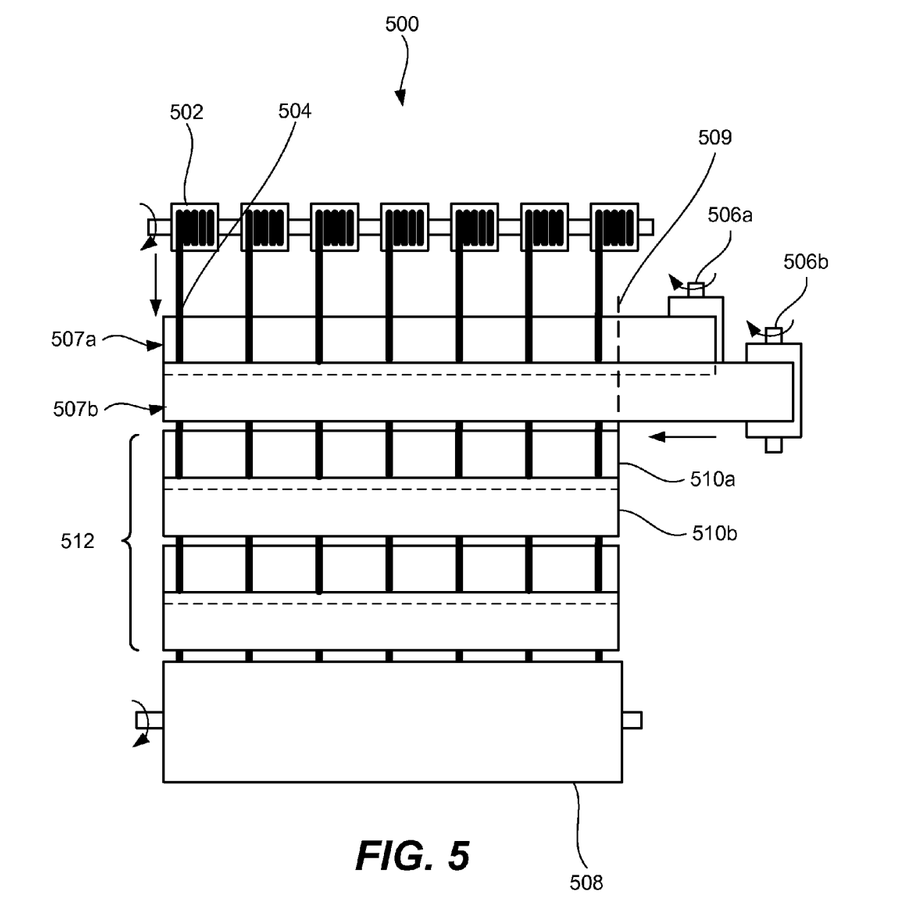
FIG. 5 illustrates a schematic view of an apparatus for fabricating an interconnect wire network assembly, in accordance with certain embodiments.

FIG. 5 illustrates a schematic view of an apparatus 500 for fabricating an interconnect wire network assembly, in accordance with certain embodiments. Apparatus 500 includes multiple spools 502 providing multiple wires 504. Wires 504 remain under tension provided by a rewind roller 508, which is used for the winding of sub-assemblies. The pitch between wires 504 may be specific to the positioning of spools 502 and/or a guiding mechanism (not shown).

Returning to FIG. 4, process 400 then continues with applying one carrier film onto the first surface of the wires in operation 406 and applying another carrier film onto the second surface of the wires in operation 408. These operations may be performed in parallel or in series. For example, one carrier film may be initially attached to the wires followed by a separate operation in which another carrier film is attached to the wires. In another example, both films are applied in the same operation. Edges of the two films can be aligned during this part of the process. Furthermore, in certain embodiments, one or both films are applied substantially perpendicular to the unwinding direction. Finally, this part of the process may also involve cutting the carrier films, if the films are supplied from continuous rolls. Overall, in certain embodiments, a product of this part of the process is a set of continuous wires with two strips of carrier film attached to the opposite sides of this set of wires. It should be noted that the operation of applying carrier film strips continues as wires are being unrolled and fed through the application area.

As shown in FIG. 5, apparatus 500 also includes two carrier film rolls 506a and 506b, which supply the two films onto the two surfaces of the extended wires 504. A mechanism (not shown) may be employed for grabbing free ends 507a and 507b of the carrier films to extend these films from rolls 506a and 506b and into position with respect to wires 504. A cutting mechanism (not shown) may be employed for cutting the carrier films from the rolls 506a and 506b along a cutting line 509. A roll-type or guillotine-type cutter can be used for these purposes. Cutting forms carrier film strips 510a and 510b, which are carried by wires 504 to subassembly roll 508.

In certain embodiments, applying a carrier film to the wires involves passing an electric current through at least a portion of the wires that is in contact with the carrier films. The electrical current heats this portion of the wires, which may help to adhere the carrier film to the wires. For example, two metal rollers may be put in temporary contact with wires in the post-application zone 512. A predetermined voltage may be applied to the rollers at least during the contact period to drive current through the wires and heat the wires. Further, a pressure may be applied between wires 504 and carrier film strips 510a and 510b by, for example, passing a subassembly through nip rollers (e.g., heated rollers) in the post-application zone.

Figure 6A:
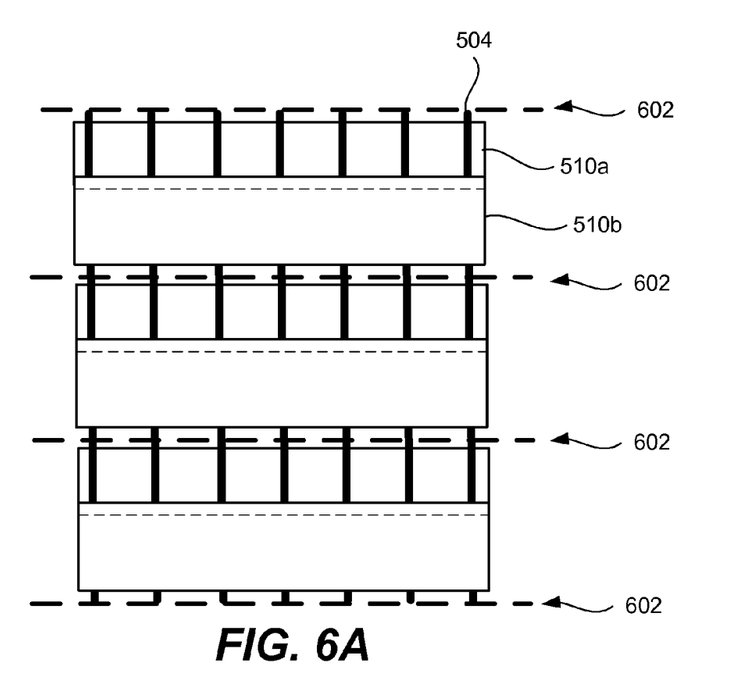
FIG. 6A is a schematic representation of a technique for cutting a subassembly to form an interconnect wire network assembly, in accordance with certain embodiments.
Figure 6B:
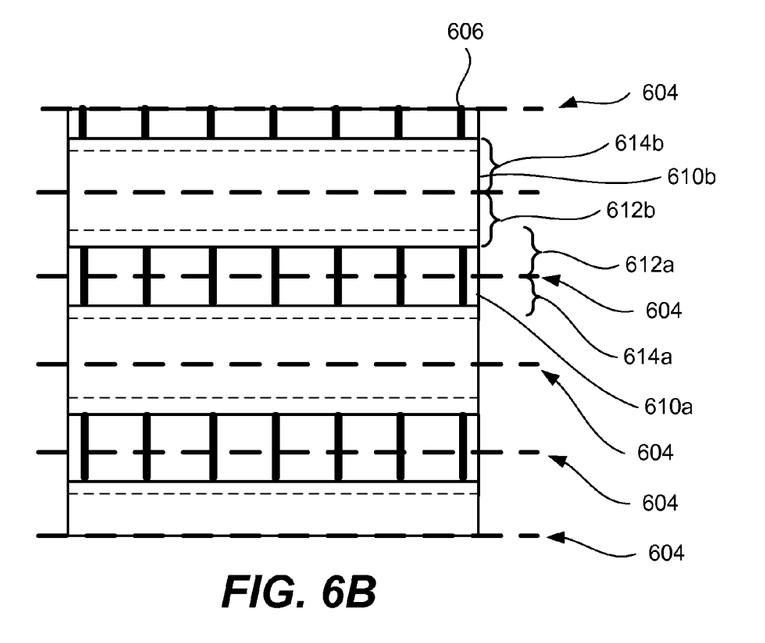
FIG. 6B is a schematic representation of another technique for cutting a subassembly to form an interconnect wire network assembly, in accordance with different embodiments.

Returning to FIG. 4, process 400 may proceed with an optional operation 410, during which continuous wires with carrier film films may be formed into a roll as, for example, shown in FIG. 5. This roll is considered to be a sub-assembly and may be stored prior to further processing, which involves unwinding the toll and cutting the wires to form interconnect wire network assemblies. Process 400 may then proceed with cutting wires across their length (e.g., in a direction substantially perpendicular to the wires) to form the interconnect wire network assembly in operation 412. It should be noted that operation 412 may proceed without forming an intermediate subassembly (i.e., without an intermediate optional operation 410). A guillotine-type of cutter may be used for this purpose. Operation 412 may involve cutting only the wires in the areas free of the carrier films. An example of such an operation is shown in FIG. 6A. Cutting lines 602 are depicted with heavy dashed lines (thin dashed lines correspond to the hidden edge of one carrier film strip). Cutting lines 602 pass through wires 504 but not through either one of carrier films 510a and 510b. In other embodiments, operation 412 may involve cutting both the wires and one or more carrier films. An example of such an operation is shown in FIG. 6B where cut lines 604 go through both wires and initial carrier film strips 610a and 610b. After cutting, carrier strip 610a is divided into new carrier strips 612a and 614a, while carrier strip 610b is divided into new carrier strips 612b and 614b. New carrier strips 612a and 612b together with a portion of wires 606 attached to these strips form an interconnect wire network assembly.

Figure 7:
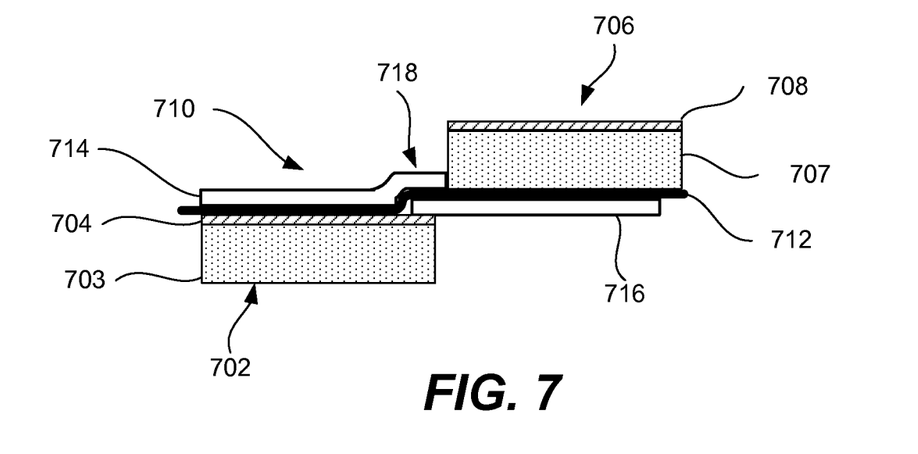
FIG. 7 illustrates a schematic side view of two photovoltaic cells electrically interconnected using an interconnect wire network assembly, in accordance with certain embodiments.

FIG. 7 illustrates a schematic side view of two photovoltaic cells 702 and 706 and an interconnect wire network assembly 710 electrically connecting these two cells, in accordance with certain embodiments. Assembly 710 includes wires 712 and two carrier films (i.e., top carrier film 714 and bottom carrier film 716). In certain embodiments, top carrier film 714 and bottom carrier film 716 are the same type of films (in terms of thickness and composition). The dimensions of top carrier film 714 and bottom carrier film 716 may be the same or different. Top carrier film 714 and bottom carrier film 716 are shown to overlap in the area 718. However, other embodiments described above with reference to FIGS. 3A, 3B, and 3C are possible. Photovoltaic cell 702 includes a substrate 703 and a photovoltaic layer 704 positioned on a front surface of a substrate. Similarly, photovoltaic cell 706 includes a substrate 707 and a photovoltaic layer 708 positioned on a front surface of a substrate. A portion of bottom carrier film 716 extends beyond the edge of photovoltaic cell 702 and over photovoltaic layer 704 of this cell. This feature may be used to prevent short circuits between photovoltaic layer 704 and substrate 703 and caused by wires 712.

Although the foregoing invention has been described in some detail for purposes of clarity of understanding, it will be apparent that certain changes and modifications may be practiced within the scope of the appended claims. It should be noted that there are many alternative ways of implementing the processes, systems and apparatus of the present invention. Accordingly, the present embodiments are to be considered as illustrative and not restrictive, and the invention is not to be limited to the details given herein.

What is claimed is:

1. A method of fabricating an interconnect wire network assembly comprising:
    unwinding multiple individual wires from corresponding multiple wire rolls;
    extending the multiple individual wires along a first unwinding direction such that the multiple individual wires are substantially parallel to each other and are at a first distance from each other, wherein the unwound multiple individual wires are positioned substantially within a first referential plane, wherein the first unwinding direction is parallel to the first referential plane, and wherein the unwound multiple individual wires form a first surface and a second surface, with the first surface and the second surface spaced apart by a cross-sectional dimension of the unwound multiple individual wires;
    extending a first carrier film in a second unwinding direction such that a bottom surface of the first carrier film faces the first surface of the unwound multiple individual wires, wherein the second unwinding direction is parallel to the first referential plane and perpendicular to the first unwinding direction;
    applying the first carrier film onto the first surface of the unwound multiple individual wires;
    extending a second carrier film in the second unwinding direction such that a top surface of the second carrier film faces the second surface of the unwound multiple individual wires; and
    applying a second carrier film onto the second surface of the multiple individual wires such that the first carrier film and the second carrier film partially overlap when viewed from a direction perpendicular to the first referential plane.

2. The method of fabricating an interconnect wire network assembly of claim 1, further comprising:
    forming a roll of interconnect wire network subassemblies;
    unwinding the roll of interconnect wire network subassemblies; and
    cutting the multiple individual wires substantially perpendicular to the multiple individual wires to form the interconnect wire network assembly.

3. The method of fabricating an interconnect wire network assembly of claim 1, further comprising cutting the unwound multiple individual wires substantially perpendicular to the multiple individual wires to form the interconnect wire network assembly.

4. The method of fabricating an interconnect wire network assembly of claim 3, wherein cutting the unwound multiple individual wires comprises cutting the first carrier film or the second carrier film.

5. The method of fabricating an interconnect wire network assembly of claim 1, wherein applying the first carrier film comprises passing an electric current through a portion of the unwound multiple individual wires that is in contact with the first carrier film in order to heat this portion.

6. The method of fabricating an interconnect wire network assembly of claim 5, wherein applying the first carrier film further comprises applying a pressure to the first carrier film and the unwound multiple individual wires.

7. The method of fabricating an interconnect wire network assembly of claim 1, wherein applying the second carrier film comprises passing an electric current through a portion of the unwound multiple individual wires that is in contact with the second carrier film in order to heat this portion.

8. The method of fabricating an interconnect wire network assembly of claim 7, wherein applying the second carrier film further comprises applying a pressure to the second carrier film and the unwound multiple individual wires.

9. The method of fabricating an interconnect wire network assembly of claim 1, wherein:
    applying the first carrier film comprises passing an electric current through a portion of the unwound multiple individual wires that is in contact with the first carrier film in order to heat this portion, and
    applying the second carrier film comprises passing an electric current through a portion of the unwound multiple individual wires that is in contact with the second carrier film in order to heat this portion.

10. The method of fabricating an interconnect wire network assembly of claim 1, wherein:
    applying the first carrier film further comprises applying a pressure to the first carrier film and the unwound multiple individual wires, and
    applying the second carrier film further comprises applying a pressure to the second carrier film and the unwound multiple individual wires.

* * * * *